United States Patent
Shin et al.

(10) Patent No.: US 8,298,852 B2
(45) Date of Patent: Oct. 30, 2012

(54) THIN FILM TYPE SOLAR CELL AND METHOD FOR MANUFACTURING THE SAME

(75) Inventors: Yong Woo Shin, Yongin-si (KR); Won Hyun Kim, Cheonan-si (KR); Dae Yup Na, Busan (KR); Hyun Jun Cho, Namyangju-si (KR); Dong Woo Kang, Gwangju-si (KR); Doo Young Kim, Taebaek-si (KR); Hyun Kyo Shin, Seoul (KR); Cheol Hoon Yang, Seongnam-si (KR)

(73) Assignee: Jusung Engineering Co., Ltd., Seoul (KR)

( * ) Notice: Subject to any disclaimer, the term of this patent is extended or adjusted under 35 U.S.C. 154(b) by 182 days.

(21) Appl. No.: 12/460,005

(22) Filed: Jul. 10, 2009

(65) Prior Publication Data

US 2010/0167458 A1    Jul. 1, 2010

(30) Foreign Application Priority Data

Dec. 29, 2008 (KR) .................. 10-2008-0135936
Apr. 24, 2009 (KR) .................. 10-2009-0036121

(51) Int. Cl.
*H01L 21/00* (2006.01)

(52) U.S. Cl. .................. 438/73; 257/E27.123; 136/244

(58) Field of Classification Search .................... 438/73; 257/E27.123–E21.126; 136/244
See application file for complete search history.

(56) References Cited

U.S. PATENT DOCUMENTS

| | | |
|---|---|---|
| 4,667,058 A | 5/1987 | Catalano et al. |
| 5,254,179 A | 10/1993 | Ricaud et al. |
| 5,334,259 A | 8/1994 | Mizumura et al. |

(Continued)

FOREIGN PATENT DOCUMENTS

DE    692 28 079 T2    9/1999
(Continued)

OTHER PUBLICATIONS

Chinese Office Action with English translation dated Oct. 18, 2011; Chinese Patent Application No. CN200910170319.8; 8 pages; The State Intellectual Property Office of P.R.C., People's Republic of China.

(Continued)

*Primary Examiner* — Shaun Campbell
(74) *Attorney, Agent, or Firm* — The Law Offices of Andrew D. Fortney; Andrew D. Fortney; Ryan S. Dunning

(57) ABSTRACT

A thin film type solar cell and a method for manufacturing the same is disclosed, which is capable of providing a wide light-transmission area without lowering cell efficiency and increasing processing time, so that the solar cell can be used as a substitute for a glass window in a building. The thin film type solar cell generally comprises a substrate; a plurality of front electrodes at fixed intervals on the substrate; a plurality of semiconductor layers at fixed intervals with a contact portion or separating channel interposed in-between, the plurality of semiconductor layers on the plurality of front electrodes; and a plurality of rear electrodes at fixed intervals by the each separating channel interposed in-between, the each rear electrode being electrically connected with the each front electrode; wherein the each rear electrode is patterned in such a way that a light-transmitting portion is included in a predetermined portion of the rear electrode.

20 Claims, 16 Drawing Sheets

U.S. PATENT DOCUMENTS

| | | | |
|---|---|---|---|
| 6,271,053 | B1 | 8/2001 | Kondo |
| 7,683,379 | B2 * | 3/2010 | Goto et al. .................. 257/79 |
| 2002/0026955 | A1 * | 3/2002 | Ouchida et al. ............. 136/251 |
| 2003/0079772 | A1 | 5/2003 | Gittings et al. |
| 2003/0116185 | A1 * | 6/2003 | Oswald ...................... 136/251 |
| 2006/0038301 | A1 * | 2/2006 | Suzuki ........................ 257/775 |
| 2006/0096632 | A1 | 5/2006 | Oswald |
| 2006/0266409 | A1 | 11/2006 | Takeda et al. |
| 2007/0131272 | A1 | 6/2007 | Lim et al. |
| 2009/0035536 | A1 * | 2/2009 | Tanaka et al. ............. 428/195.1 |
| 2009/0255572 | A1 | 10/2009 | Oswald |
| 2009/0284275 | A1 * | 11/2009 | Chou et al. ................ 324/754 |
| 2010/0059110 | A1 * | 3/2010 | Sheng et al. ............... 136/255 |
| 2010/0243052 | A1 | 9/2010 | Gittings et al. |

FOREIGN PATENT DOCUMENTS

| | | |
|---|---|---|
| DE | 100 05 330 A1 | 9/2001 |
| DE | 10 2004 057 663 A1 | 3/2006 |
| JP | 6-104465 A | 4/1994 |
| JP | 8-139351 A | 5/1996 |
| JP | 2000-340814 A | 12/2000 |
| JP | 2002-280579 A | 9/2002 |
| JP | 2006-332453 A | 12/2006 |
| JP | 2007-088280 A | 4/2007 |
| JP | 2007-165902 A | 6/2007 |

OTHER PUBLICATIONS

German Office Action dated Oct. 21, 2011; German Patent Application No. 10 2009 041 941.1; 6 pages; German Patent Office, Germany.

Jacques Schmitt, Alain Ricaud, Jean-Marie Siefert and Thierry Emeraud; "Photovoltaic Device and Solar Module with Partial Transparency, and Fabrication Method"; Espacenet; German Publication No. DE69228079 (T2); Publication Date: Sep. 16, 1999; Espacenet Database—Worldwide; http://worldwide.espacenet.com/.

Claus-Peter Klages, Thorsten Matthee, Frank Neumann and Bernd Szyszka; "Method of Manufacturing Transparent Conducting Structures and Use of Transparent Conducting Oxide Layers to Pattern Transparent Conducting Regions"; Espacenet; German Publication No. DE10005330 (A1); Publication Date: Sep. 6, 2001; Espacenet Database—Worldwide; http://worldwide.espacenet.com/.

Hartmut Nussbaumer, Wolfgang Joos, Lothar Weber, Arnd Boueke and Roland Burkhardt; "Solar Module"; Espacenet; German Publication No. DE102004057663 (A1); Publication Date:Mar. 30, 2006; Espacenet Database—Worldwide; http://worldwide.espacenet.com/.

Takuro Ihara; "Thin Film Solar Battery and Manufacture Thereof"; Espacenet; Japanese Publication No. JP6104465 (A); Publication Date: Apr. 15, 1994; Espacenet Database—Worldwide; http://worldwide.espacenet.com/.

Mikihiko Nishitani and Takahiro Wada; "Method and Apparatus for Manufacturing Solar Cell Module"; Espacenet; Japanese Publication No. JP8139351 (A); Publication Date: May 31, 1996; Espacenet Database—Worldwide; http://worldwide.espacenet.com/.

Masataka Kondo; "Manufacture of Thin-Film Solar Cell Module"; Espacenet; Japanese Publication No. JP2000340814 (A); Publication Date: Dec. 8, 2000; Espacenet Database—Worldwide; http://worldwide.espacenet.com/.

Toshinobu Nakada and Katsuhiko Hayashi; "Integrated Thin Film Solar Cell Manufacturing Method"; Espacenet; Japanese Publication No. JP2002280579 (A); Publication Date: Sep. 27, 2002; Espacenet Database—Worldwide; http://worldwide.espacenet.com/.

Toru Takeda and Shinsuke Tachibana; "Thin Film Solar Battery and Method for Manufacturing the Same"; Espacenet; Japanese Publication No. JP2006332453 (A); Publication Date: Dec. 7, 2006; Espacenet Database—Worldwide; http://worldwide.espacenet.com/.

Takashi Ito and Hiroyuki Unosawa; "Transmissive Solar Battery Module"; Espacenet; Japanese Publication No. JP2007088280 (A); Publication Date: Apr. 5, 2007; Espacenet Database—Worldwide; http://worldwide.espacenet.com/.

Koeng Lim, Seong Won Kwon, Junfan Kuaku, Sang Il Park, Ji Hwan Yang, Sang Hwan Kim, Too Jin Lee and Jin Koog Shin; "Transmissive Integrated Thin-Film Solar Cell and Method of Manufacturing Same, and Method for Electrically Connecting Unit Cell of Transmissive Integrated Thin-Film Solar Cell in Series"; Espacenet; Japanese Publication No. JP2007165902 (A); Publication Date: Jun. 28, 2007; Espacenet Database—Worldwide; http://worldwide.espacenetcom/.

* cited by examiner

OVER-ETCHED PORTIONS

THIN FILM TYPE SOLAR CELL AND METHOD FOR MANUFACTURING THE SAME

CROSS REFERENCE TO RELATED APPLICATIONS

This application claims the benefit of the Korean Patent Application Nos. P2008-0135936 filed on Dec. 29, 2008, and P2009-0036121 filed on Apr. 24, 2009, which are hereby incorporated by reference as if fully set forth herein.

BACKGROUND OF THE INVENTION

1. Field of the Invention

The present invention relates to a thin film type solar cell, and more particularly, to a thin film type solar cell with a large light-transmission area, which can be used as a substitute for a glass window in a building.

2. Discussion of the Related Art

A solar cell with a property of semiconductor converts a light energy into an electric energy.

A structure and principle of the solar cell according to the related art will be briefly explained as follows. The solar cell is formed in a PN-junction structure where a positive (P)-type semiconductor makes a junction with a negative (N)-type semiconductor. When a solar ray is incident on the solar cell with the PN-junction structure, holes (+) and electrons (−) are generated in the semiconductor owing to the energy of the solar ray. By an electric field generated in a PN-junction area, the holes (+) are drifted toward the P-type semiconductor and the electrons (−) are drifted toward the N-type semiconductor, whereby an electric power is produced with an occurrence of electric potential.

Solar cells can be largely classified into a wafer type solar cell and a thin film type solar cell.

The wafer type solar cell uses a wafer made of a semiconductor material such as silicon. In the meantime, the thin film type solar cell is manufactured by forming a semiconductor in type of a thin film on a glass substrate.

With respect to efficiency, the wafer type solar cell is better than the thin film type solar cell. However, in the case of the wafer type solar cell, it is difficult to realize a small thickness due to difficulty in performance of the manufacturing process. In addition, the wafer type solar cell uses a high-priced semiconductor substrate, whereby its manufacturing cost is increased. For the wafer type solar cell, it is difficult to obtain a light-transmission area therein, so that the wafer type solar cell can not be used as a substitute for a glass window in a building.

In the meantime, even though the thin film type solar cell is inferior in efficiency to the wafer type solar cell, the thin film type solar cell has advantages such as realization of thin profile and use of low-priced material. Accordingly, the thin film type solar cell is suitable for a mass production. In addition, since the thin film type solar cell can obtain a light-transmission area with easiness, the thin film type solar cell can be used as a substitute for a glass window in a building.

Hereinafter, a related art thin film type solar cell will be described with reference to the accompanying drawings.

FIG. 1 is a perspective view illustrating a related art thin film type solar cell.

As shown in FIG. 1, the related art thin film type solar cell includes a substrate 10; a plurality of front electrodes 20; a semiconductor layer 30; and a transparent conductive layer 40. At this time, the plurality of front electrodes 20 are formed at fixed intervals on the substrate 10, and then the semiconductor layer 30 and the transparent conductive layer 40 are sequentially formed on the plurality of front electrodes 20. Also, each contact portion 35 and each separating channel 55 are formed in the semiconductor layer 30 and the transparent conductive layer 40. Then, a plurality of rear electrodes 50 are formed on the transparent conductive layer 40. Each rear electrode 50 is electrically connected with the front electrode 20 by the contact portion 35, and the plurality of rear electrodes 50 are formed at fixed intervals by each separating channel 55 interposed in-between.

However, the related art thin film type solar cell when being used as the substitute for the glass window in the building has the following disadvantages.

In order to use the thin film type solar cell as the substitute for the glass window in the building, it is necessary for the thin film type solar cell to obtain the light-transmission area therein at any size. Since the related art thin film type solar cell includes the front electrode 20 using transparent metal and the rear electrode 50 using opaque metal, the light-transmission area is limited to the separating channel 55 positioned between each of the rear electrodes 50. Accordingly, the limited light-transmission area in the related art type film type solar cell can not secure a wide visible range.

To widen the light-transmission area, the separating channel 55 positioned between each of the rear electrodes 50 may be increased in its width. This method may cause problems of lowering cell efficiency and increasing process time. That is, if increasing the width of the separating channel 55, an effective area for production of cell power, is decreased by the increased width of the separating channel 5, this can lower the cell efficiency. Also, the separating channel 55 is formed by a laser scribing process, whereby the laser scribing process has to be performed repetitively to increase the width of the separating channel 55, thereby causing a problem of long process time.

SUMMARY OF THE INVENTION

Accordingly, the present invention is directed to a thin film type solar cell and a method for manufacturing the same that substantially obviates one or more problems due to limitations and disadvantages of the related art.

An aspect of the present invention is to provide a thin film type solar cell and a method for manufacturing the same, which is capable of securing a wide light-transmission area without lowering cell efficiency and increasing processing time, so that it can be used as a substitute for a glass window in a building.

Additional features and aspects of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a thin film type solar cell comprises a substrate; a plurality of front electrodes at fixed intervals on the substrate; a plurality of semiconductor layers at fixed intervals by each contact portion or separating channel interposed in-between, the plurality of semiconductor layers on the plurality of front electrodes; and a plurality of rear electrodes at fixed intervals by the each separating channel interposed in-between, the each rear electrode being electrically connected with the each front electrode; wherein the each rear electrode is patterned in such a way that a light-transmitting portion is included in a predetermined portion of the rear electrode.

In another aspect of the present invention, a method for manufacturing a thin film type solar cell comprises forming a plurality of front electrodes at fixed intervals on a substrate; forming a semiconductor layer on an entire surface of the substrate including the plurality of front electrodes; forming a plurality of contact portions and separating channels by removing predetermined portions of the semiconductor layer; and patterning a plurality of rear electrodes at fixed intervals by each separating channel interposed in-between, wherein the each rear electrode is electrically connected with the front electrode through the contact portion, and the each rear electrode includes a light-transmitting portion therein so as to enhance a light-transmission area.

In another aspect of the present invention, a method for manufacturing a thin film type solar cell comprises forming a plurality of front electrodes at fixed intervals on a substrate; forming a semiconductor layer on an entire surface of the substrate including the plurality of front electrodes; forming a plurality of contact portions by removing predetermined portions of the semiconductor layer; patterning a plurality of rear electrodes at fixed intervals by each separating channel interposed in-between, wherein the each rear electrode is electrically connected with the front electrode through the contact portion, and the each rear electrode includes a light-transmitting portion therein so as to enhance a light-transmission area; and removing the semiconductor layer from the light-transmitting portion and separating channel under such circumstance that the rear electrode is used as a mask.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 5(C) is a cross section view along C-C of FIG. 5;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a thin film type solar cell according to the present invention and a method for manufacturing the same will be described with reference to the accompanying drawings.

This Film Type Solar Cell

Figure 1:
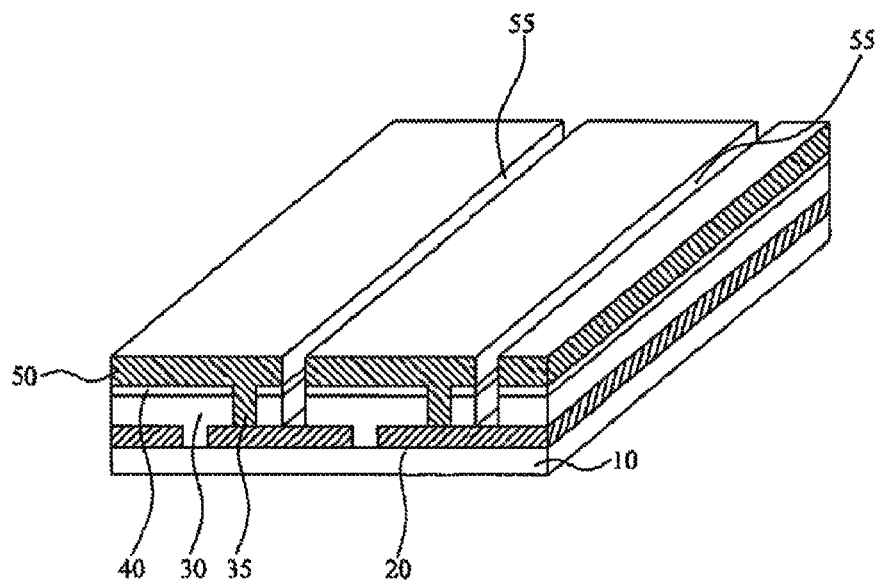
FIG. 1 is a perspective view illustrating a related art thin film type solar cell.
Figure 2:
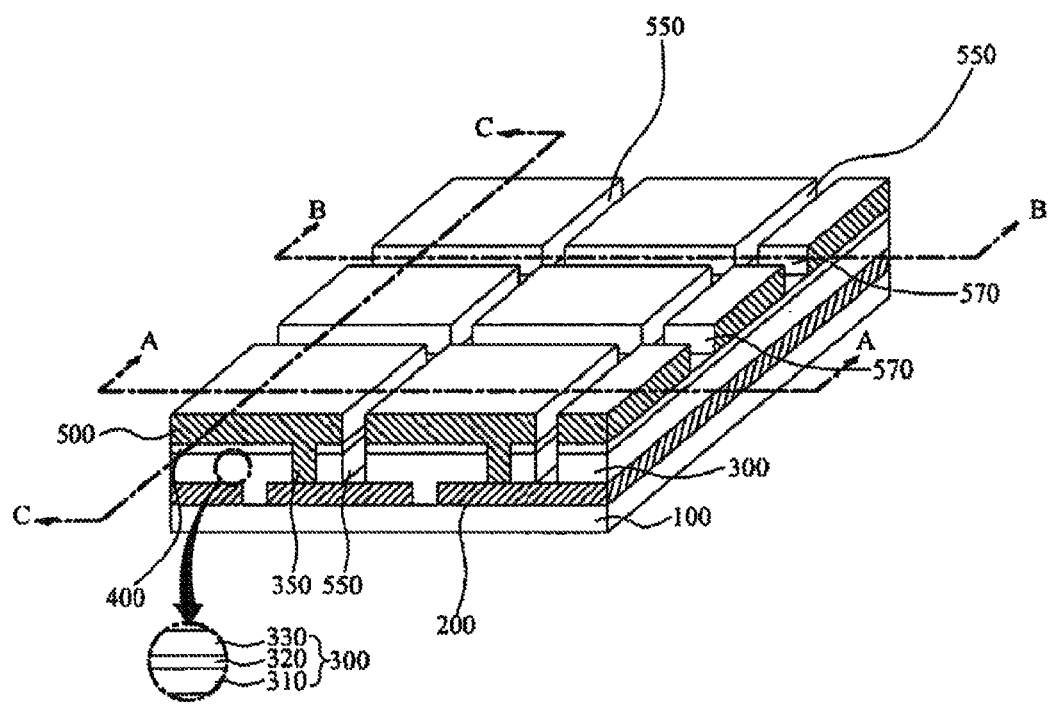
FIG. 2 is a perspective view illustrating a thin film type solar cell according to one embodiment of the present invention.
Figure 3A:
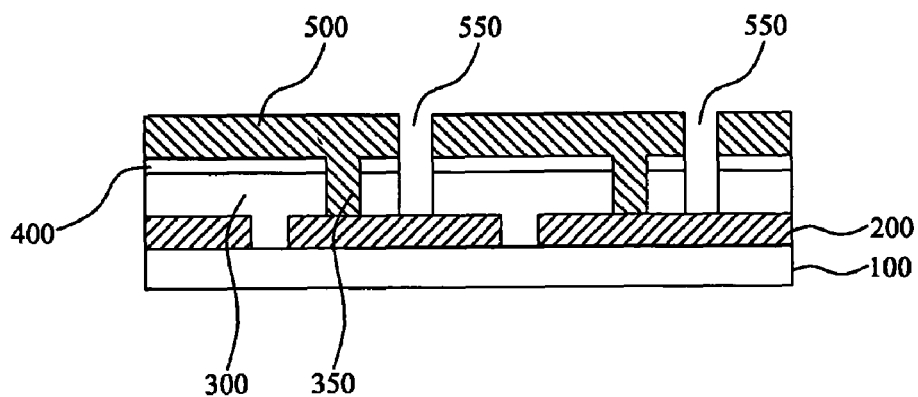
FIG. 3(A) is a cross section view along A-A of FIG. 2.
Figure 3B:
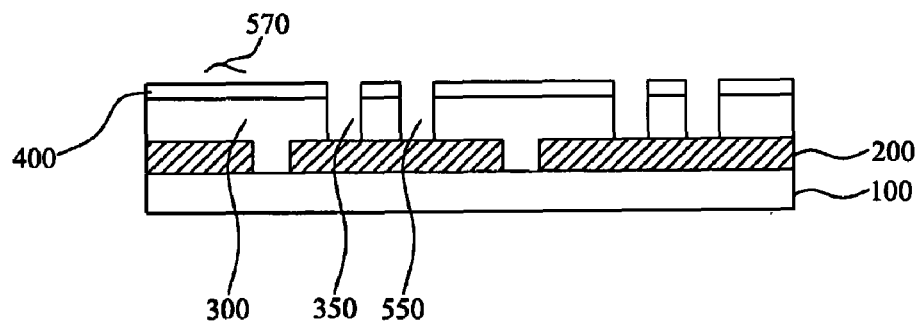
FIG. 3(B) is a cross section view along B-B of FIG. 2.
Figure 3C:
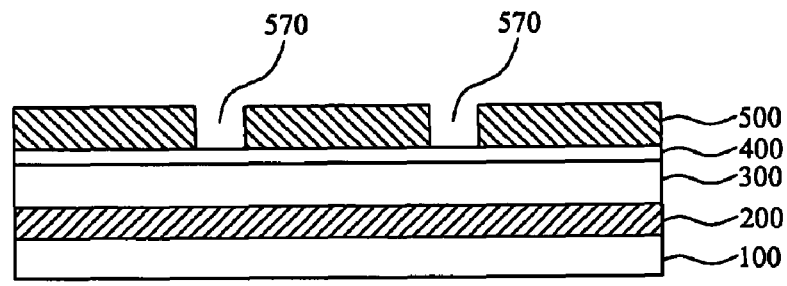
FIG. 3(C) is a cross section view along C-C of FIG. 2.

FIG. 2 is a perspective view illustrating a thin film type solar cell according to one embodiment of the present invention. FIG. 3(A) is a cross section view along A-A of FIG. 2, FIG. 3(B) is a cross section view along B-B of FIG. 2, and FIG. 3(C) is a cross section view along C-C of FIG. 2.

As shown in FIG. 2 and FIG. 3(A to C), a thin film type solar cell according to one embodiment of the present invention includes a substrate 100, a plurality of front electrodes 200, a plurality of semiconductor layers 300, a plurality of transparent conductive layers 400, and a plurality of rear electrodes 500.

The substrate 100 may be formed of glass or transparent plastic.

The plurality of front electrodes 200 may be formed at fixed intervals on the substrate 100, wherein the front electrode 200 may be made of a transparent conductive material, for example, ZnO, ZnO:B, ZnO:Al, $SnO_2$, $SnO_2$:F, or ITO (Indium Tin Oxide). The front electrode 200 corresponds to a solar-ray incidence face. In this respect, it is important for the front electrode 200 to transmit the solar ray into the inside of the solar cell with the maximized absorption of solar ray. For this, the front electrode 200 may have an uneven structure. If forming the front electrode 200 of the uneven structure, a solar-ray reflection ratio on the solar cell is decreased, and a solar-ray absorption ratio into the solar cell is increased owing to a dispersion of the solar ray, thereby improving cell efficiency.

The plurality of semiconductor layers 300 are formed on the front electrodes 200, and are positioned at fixed intervals by each contact portion 350 or each separating channel 550 interposed in-between. The semiconductor layers 300 may be made of a silicon-based semiconductor material, and the semiconductor layer 300 may be formed in a PIN structure where a P-type semiconductor layer, an I-type semiconductor layer, and an N-type semiconductor layer are deposited in sequence. In the semiconductor layer 300 with the PIN structure, depletion is generated in the I-type semiconductor layer by the P-type semiconductor layer and the N-type semiconductor layer, whereby an electric field occurs therein. Thus, electrons and holes generated by the solar ray are drifted by the electric field, and the drifted electrons and holes are collected in the N-type semiconductor layer and the P-type semiconductor layer, respectively. If forming the semiconductor layer 300 with the PIN structure, the P-type semiconductor layer is firstly formed on the front electrode 200, and then the I-type and N-type semiconductor layers are formed thereon, preferably. This is because a drift mobility of the hole is less than a drift mobility of the electron. In order to maximize the efficiency in collection of the incident light, the P-type semiconductor layer is provided adjacent to the light-incidence face.

As shown in the expanded inset of FIG. 2, the semiconductor layer 300 may be formed in a tandem structure in which a first semiconductor layer 310, a buffer layer 320 and a second semiconductor layer 330 are deposited in sequence.

Each of the first and second semiconductor layers 310 and 330 may be formed in the PIN structure (described above) where the P-type semiconductor layer, the I-type semiconductor layer, and the N-type semiconductor layer are deposited in sequence.

The first semiconductor layer 310 may be formed in a PIN structure of amorphous semiconductor material, and the second semiconductor layer 330 may be formed in a PIN structure of microcrystalline semiconductor material.

The amorphous semiconductor material is characterized by absorption of short-wavelength light, and the microcrystalline semiconductor material is characterized by absorption of long-wavelength light. A mixture of the amorphous semiconductor material and the microcrystalline semiconductor material can enhance light-absorbing efficiency, but it is not limited to this type of mixture. That is, the first semiconductor layer 310 may be formed of amorphous semiconductor/germanium material, or microcrystalline semiconductor material; and the second semiconductor layer 330 may be formed of amorphous semiconductor material, or amorphous semiconductor/germanium material.

The buffer layer 320 is interposed between the first and second semiconductor layers 310 and 330, wherein the buffer layer 320 enables smooth drift of electron and hole by a tunnel junction. The buffer layer 320 may be made of a transparent material, for example, ZnO.

Instead of the tandem structure, the semiconductor layer 300 may be formed in a triple structure. In case of the triple structure, each buffer layer is interposed between each of first, second and third semiconductor layers included in the semiconductor layer 300.

The plurality of transparent conductive layers 400 are formed on the semiconductor layers 300, in the same pattern type as the semiconductor layers 300. That is, the plurality of transparent conductive layers 400 are formed at fixed intervals separated by each contact portion 350 or each separating channel 550 interposed in-between. The transparent conductive layers 400 may be made of a transparent conductive material, for example, ZnO, ZnO:B, ZnO:Al, ZnO:H, or Ag. The transparent conductive layers 400 may be omitted without departing from the scope and spirit of the invention. However, in order to improve the cell efficiency, forming the transparent conductive layer 400 is preferable to omitting the transparent conductive layer 400. This is because the transparent conductive layer 400 enables the solar ray transmitted through the semiconductor layer 300 to be dispersed in all angles, whereby the solar ray is reflected on the rear electrode layer 500 and is then re-incident on the semiconductor layer 300, thereby resulting in the improved cell efficiency.

The semiconductor layers 300 and transparent conductive layers 400 may each initially be formed as a single continuous layer, and the plurality of contact portions 350 and separating channels 550 are then formed by removing predetermined portions of the semiconductor layers 300 and transparent conductive layers 400 to yield the configuration shown. Thus, the plurality of contact portions 350 and separating channels 550 are formed at fixed intervals.

Each rear electrode 500 is electrically connected with the front electrode 200 by the contact portion 350, wherein the plurality of rear electrodes 500 are formed at fixed intervals by each separating channel 550 interposed in-between. The rear electrode 500 may be made of a metal material, for example, Ag, Al, Ag+Mo, Ag+Ni, or Ag+Cu.

Next, a plurality of light-transmitting portions 570 are formed in predetermined patterns in the respective rear electrodes 500. The light-transmitting portions 570 interrupt the metal material of the rear electrode 500. Through the light-transmitting portions 570, the transparent conductive layer 400 is exposed so that the semiconductor layer 300, the front electrode 200, and the substrate 100 (sequentially positioned beneath the exposed transparent conductive layer 400) can transmit solar rays. Eventually, the solar rays incident on the substrate 100 from its lower side can be transmitted out through the light-transmitting portion 570, and this effectively allows the light-transmission area of the solar cell to be increased in size. If the transparent conductive layer 400 is not formed on the semiconductor layer 300, the semiconductor layer 300 may be exposed through the light-transmitting portion 570.

As shown in FIG. 2, the light-transmitting portions 570 may each be formed in a straight-line pattern, but are not limited to this pattern. The light-transmitting portions 570 may be formed in various patterns in the rear electrode 500.

Figure 4A:
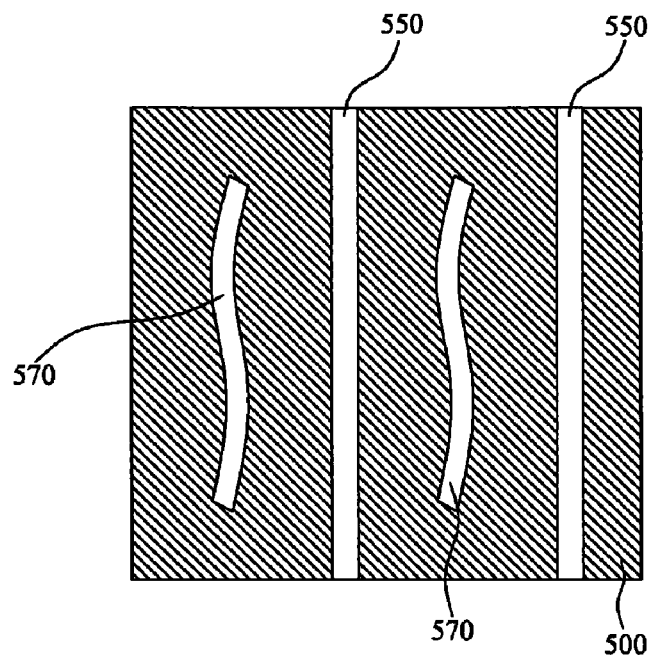
FIGS. 4(A and B) is a series of plan views illustrating various patterns of a light-transmitting portion according to the present invention.
Figure 4B:
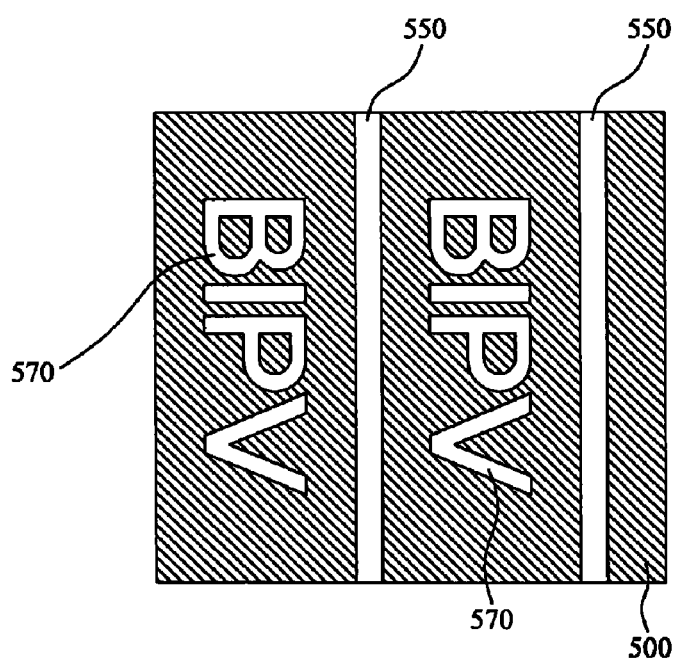

FIGS. 4(A and B) are plan views (relative to FIG. 2) illustrating various alternative patterns of the light-transmitting portion 570 according to the present invention. As shown in FIG. 4(A), the light-transmitting portion 570 may be formed in a curved-line pattern. As shown in FIG. 4(B), the light-transmitting portion 570 may be formed in a letter-shaped pattern. Although not shown, the light-transmitting portion 570 may be formed in a symbol-shaped pattern, or other shapes as a matter of design choice.

In case of the thin film type solar cell according to one embodiment of the present invention, the solar ray can be transmitted through the light-transmitting portion 570 as well as the separating channel 550. In this case the light-transmission area is increased because the light-transmitting portions 570 enable the transmittance of the solar rays, in contrast to the related art. Consequently, the thin film type solar cell according to the present invention can obtain the enough visible range to be used as a substitute for a glass window. Moreover, the light-transmission area of the solar cell can be determined by adjusting the entire size of the light-transmitting portions 570. The visible range can be changed appropriately if needed. Furthermore, the light-transmitting portion 570 formed in the letter-shaped pattern or symbol-shaped pattern can realize the effect of advertisement.

Figure 5:
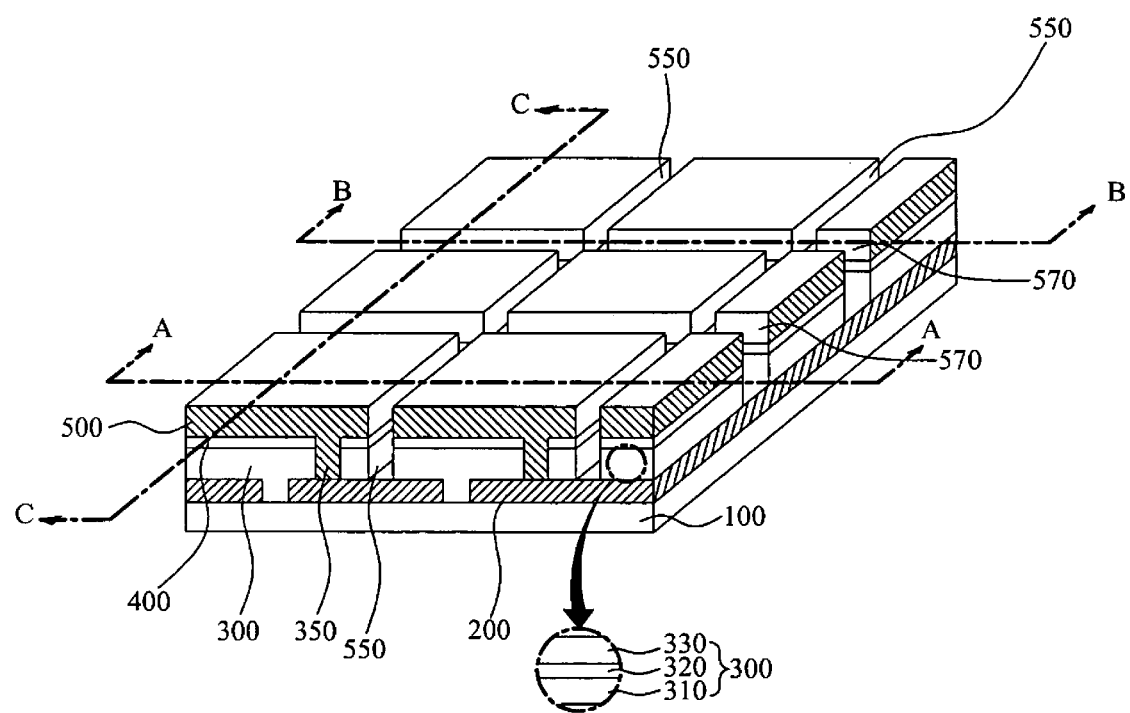
FIG. 5 is a perspective view illustrating a thin film type solar cell according to another embodiment of the present invention.
Figure 6A:
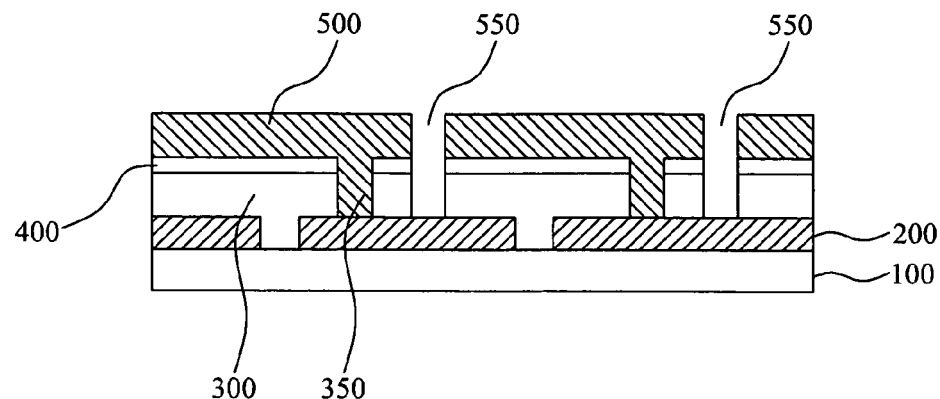
FIG. 6(A) is a cross section view along A-A of FIG. 5.
Figure 6B:
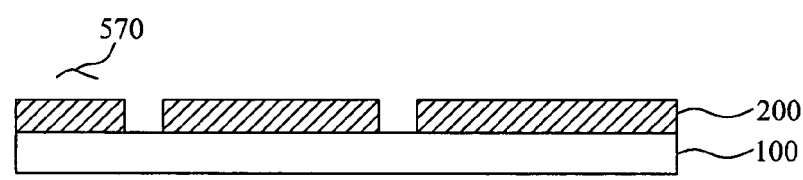
FIG. 6(B) is a cross section view along B-B of FIG. 5.

FIG. 5 is a perspective view illustrating a thin film type solar cell according to another embodiment of the present invention. FIG. 6(A) is a cross section view along A-A of FIG. 5, FIG. 6(B) is a cross section view along B-B of FIG. 5, and FIG. 5(C) is a cross section view along C-C of FIG. 5. A thin film type solar cell according to the embodiment shown in FIGS. 5-6 can be made by removing the transparent conductive layer 400 exposed through the light-transmitting portion 570 from the thin film type solar cell of FIG. 2, as well as the semiconductor layer 300 positioned beneath the removed transparent conductive layer 400. This further enhances the light-transmitting efficiency. Notwithstanding the increased depth of the light-transmitting portion 570, the thin film type solar cell of FIG. 5 is otherwise similar to the thin film type solar cell of FIG. 2. Thus, wherever possible, the same reference numbers will be used throughout the drawings to refer to the same or like parts as those of the aforementioned embodiment, and the detailed explanation for the same or like parts will be omitted.

Figure 6C:
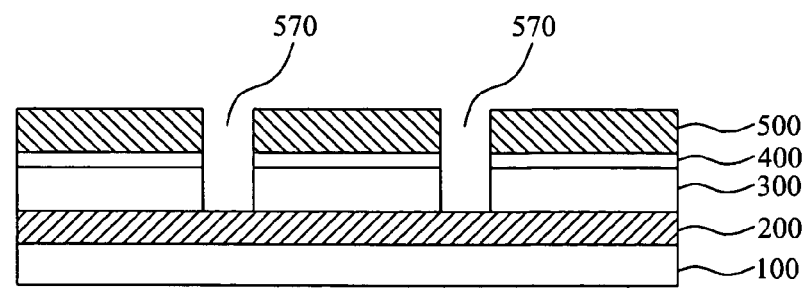

As shown in FIG. 5 and FIG. 6(A to C), the thin film type solar cell according to this alternative embodiment of the present invention includes a light-transmitting portion 570 in a rear electrode 500. Then, a front electrode 200 is exposed through the light-transmitting portion 570. Accordingly, when solar rays being incident on a substrate 100 from a lower side of the substrate 100 are transmitted through the light-transmitting portion 570, the solar rays pass through only the substrate 100 and front electrode 200. Thus, the light-transmitting efficiency in the thin film type solar cell of FIG. 5 is further enhanced when compared with that of the thin film type solar cell of FIG. 2.

FIG. 5 illustrates that the front electrode 200 is exposed through the light-transmitting portion 570 by removing the transparent conductive layer 400 positioned in the light-transmitting portion 570 and the semiconductor layer 300 positioned there under, but it is equally possible to remove only the transparent conductive layer 400 positioned in the light-transmitting portion 570.

Method for Manufacturing This Film Type Solar Cell

FIG. 7(A to D) is a series of perspective views illustrating a method for manufacturing the thin film type solar cell according to the embodiment of FIG. 2.

Figure 7A:
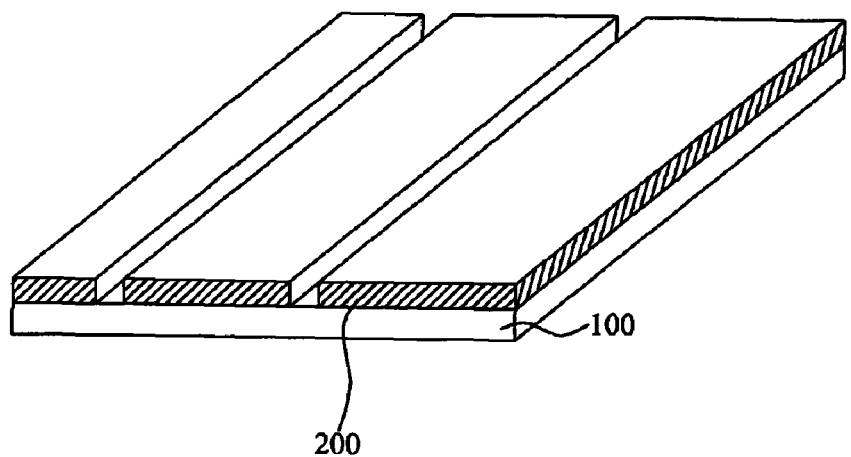
FIG. 7(A to D) is a series of perspective views illustrating a method for manufacturing a thin film type solar cell according to one embodiment of the present invention.

First, as shown in FIG. 7(A), the plurality of front electrodes 200 are formed at fixed intervals on the substrate 100.

A process for forming the plurality of front electrodes 200 is comprised of steps for forming a transparent conductive layer of ZnO, ZnO:B, ZnO:Al, SnO$_2$, SnO$_2$:F, or ITO (Indium Tin Oxide) on an entire surface of the substrate 100 by sputtering or MOCVD (Metal Organic Chemical Vapor Deposition); and removing predetermined portions of the transparent conductive layer by a laser-scribing method.

The front electrode 200 corresponds to the solar-ray incidence face. In this respect, it is important for the front electrode 200 to transmit the solar ray into the inside of the solar cell with the maximized absorption of solar ray. For this, the front electrode 200 may have an uneven surface which is made by a texturing process. The texturing process may be, for example, an etching process using photolithography, an anisotropic etching process using a chemical solution, or a groove-forming process using a mechanical scribing.

Figure 7B:
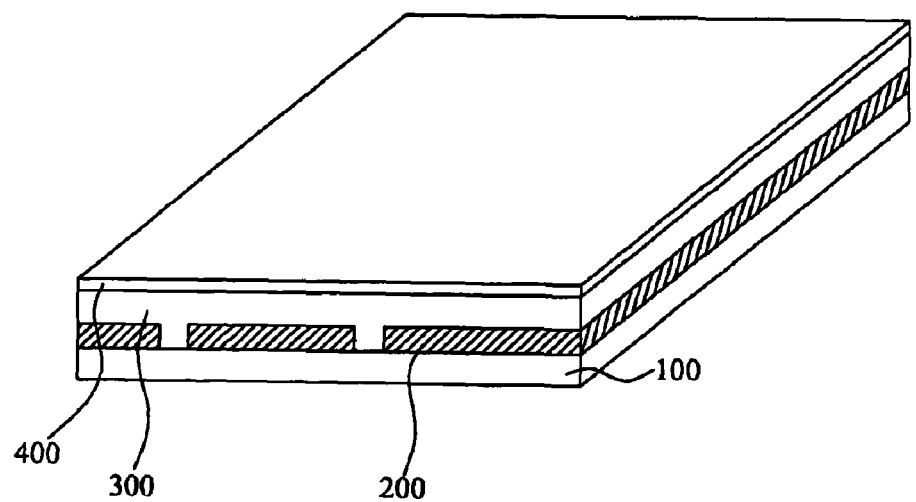

Then, as shown in FIG. 7(B), the semiconductor layer 300 and the transparent conductive layer 400 are sequentially formed as continuous layers over the entire surface of the substrate 100.

The semiconductor layer 300 may be made of the silicon-based semiconductor material, and the semiconductor layer 300 may be formed in the PIN structure or NIP structure by a plasma CVD method.

As explained above with regard to the expanded inset of FIG. 2, the semiconductor layer 300 may be formed in a tandem structure by depositing the first semiconductor layer 310, the buffer layer 320, and the second semiconductor layer 300 in sequence.

The transparent conductive layer 400 may be formed of a transparent conductive material, for example, ZnO, ZnO:B, ZnO:Al, or Ag, by sputtering or MOCVD (Metal Organic Chemical Vapor Deposition). Again, the transparent conductive layer(s) 400 may be omitted.

Figure 7C:
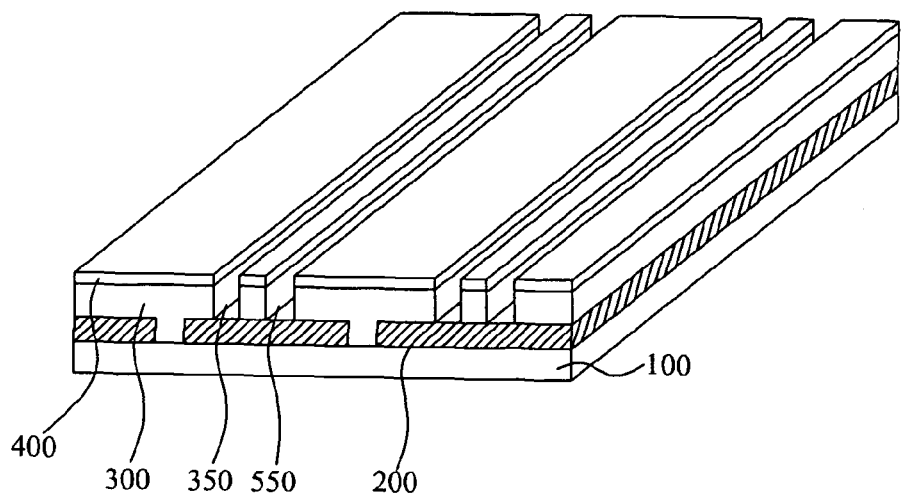

As shown in FIG. 7(C), the plurality of contact portions 350 and separating channels 550 are formed by removing the predetermined portions of the semiconductor layer 300 and transparent conductive layer 400, leaving the plurality of discrete semiconductor layers 300 and transparent conductive layers 400 illustrated in FIG. 2.

A process for forming the contact portions 350 and separating channels 550 may be performed by a laser-scribing method. The separating channels 550 may be formed after first forming the contact portions 350; the contact portions 350 may be formed after first forming the separating channels 550; or the contact portions 350 and separating channels 550 may be formed at the same time.

For example, the contact portions 350 and separating channels 550 may be simultaneously formed by one laser-beam irradiation process, which will be explained with reference to FIG. 8.

Figure 8:
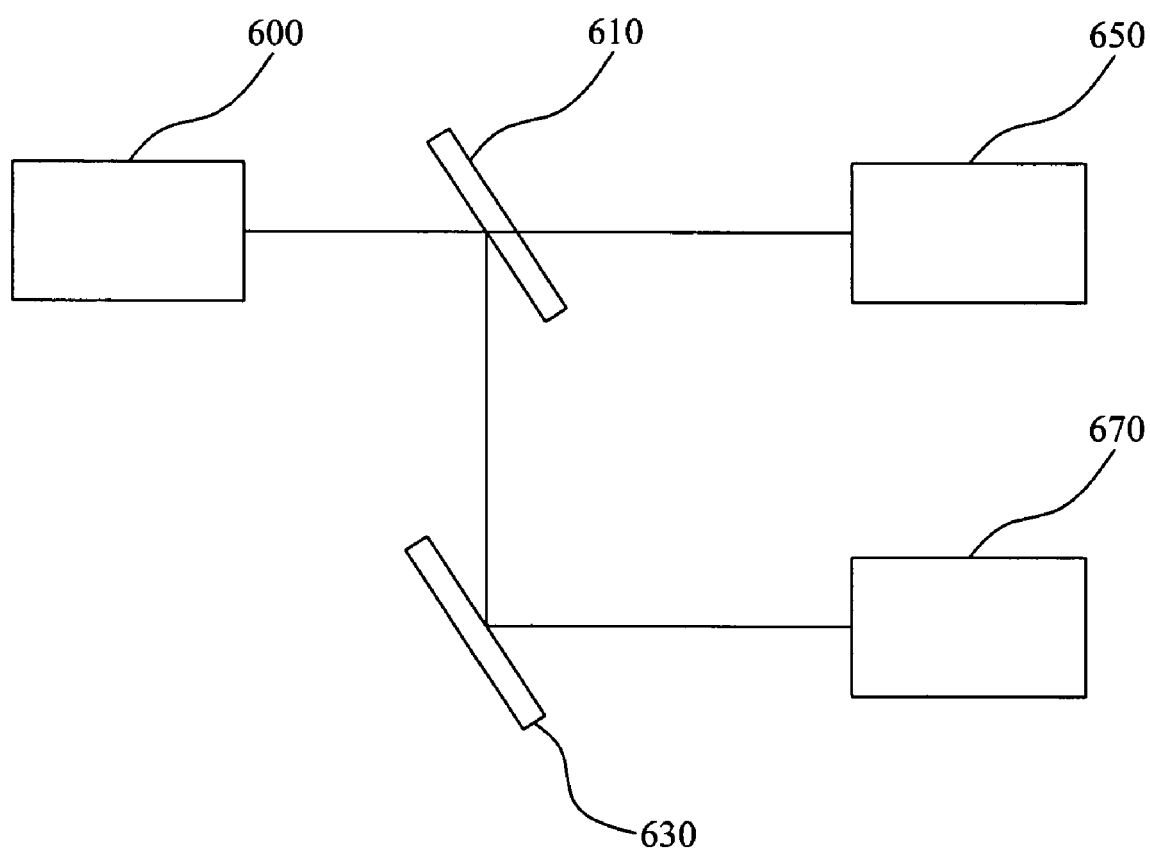
FIG. 8 is a schematic diagram illustrating a laser scribing apparatus according to one embodiment of the present invention.

FIG. 8 is a schematic diagram illustrating a laser scribing apparatus according to the present invention. As shown in FIG. 8, the laser scribing apparatus is provided with a laser oscillator 600, a first mirror 610, a second mirror 630, a first lens 650, and a second lens 670. When a laser beam is emitted from the laser oscillator 600, the emitted laser beam is incident on the first mirror 610. In this case, the half of the incident laser beam passes through the first mirror 610, and the other half of the incident laser beam is reflected on the first mirror 610. Thus, the laser beam passing through the first mirror 610 is applied to a targeted object via the first lens 650, and the laser beam reflected on the first mirror 610 is applied to the targeted object via the second lens 670 after passing through the second mirror 630. At this time, the second mirror 630 totally reflects the incident laser beam.

Eventually, the laser beam emitted from one laser oscillator 600 is divided into laser beams by the two different directions, that is, the laser beams of the two different directions enable to form the contact portion 350 and separating channel 550 at the same time.

Figure 7D:
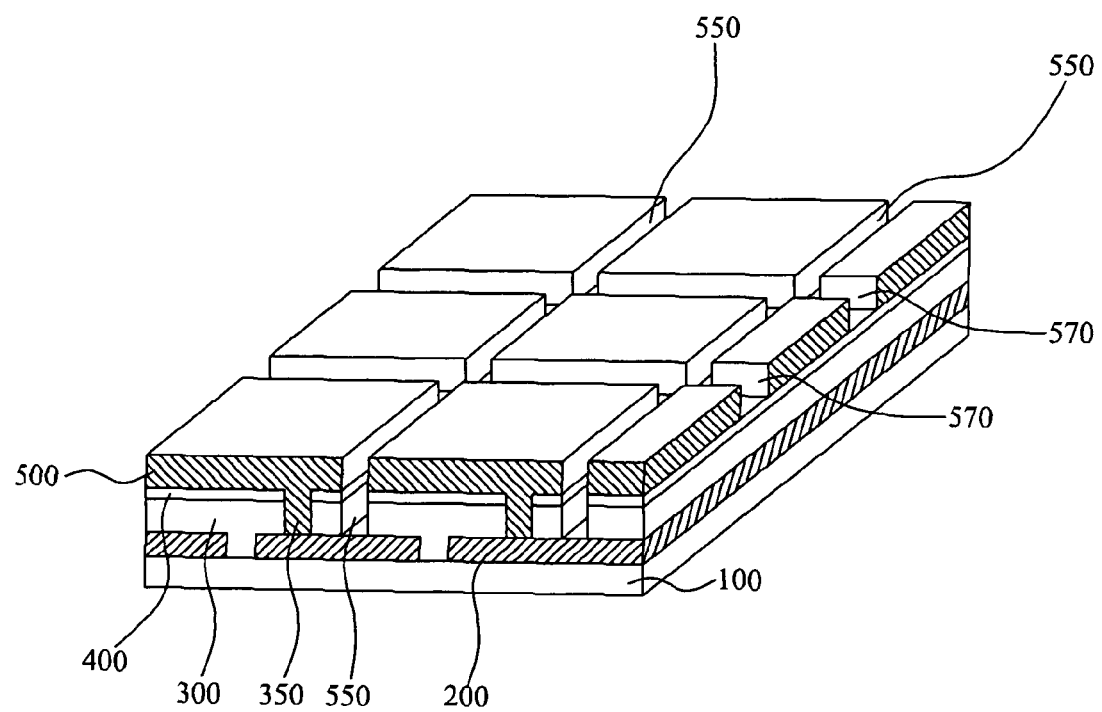

As shown in FIG. 7(D), the rear electrodes 500 are patterned, thereby completing the thin film type solar cell of FIG. 2.

Each rear electrode 500 is electrically connected with the front electrode 200 by the contact portion 350, wherein the plurality of rear electrodes 500 are formed at fixed intervals by each separating channel 550 interposed in-between. In the rear electrode 500, there is the light-transmitting portion 570 to increase the light-transmission area.

The plurality of rear electrodes 500 may be simultaneously formed by a printing process. For example, the plurality of rear electrodes 500 may be patterned through the use of metal paste such as Ag, Al, Ag+Mo, Ag+Ni, or Ag+Cu, by a screen printing process, an inkjet printing process, a gravure printing process, a gravure offset printing process, a reverse offset printing process, a flexo printing process, or a microcontact printing process.

Patterning the rear electrodes 500 by printing enables a more simplified process, and it can decrease the risk of contamination of the substrate as compared to patterning methods using a laser-scribing process. In case of the method using the printing method, it is possible to decrease the number of steps involved in performing a cleaning process, so as to prevent the substrate from being contaminated.

FIG. 9(A to E) is a series of perspective views illustrating a method for manufacturing a thin film type solar cell according to the embodiment of the thin film type solar cell of FIG. 5.

In case of the thin film type solar cell manufactured by the aforementioned method explained with reference to FIG. 7(A to D), the transparent conductive layer 400 is exposed through the light-transmitting portion 570 (if not forming the transparent conductive layer 400, the semiconductor layer 300 is exposed through the light-transmitting portion 570). However, the thin film type solar cell manufactured by the following method to be explained with reference to FIG. 9(A to E) can realize the improved light-transmitting efficiency by additionally removing the semiconductor layer 300 and transparent conductive layer 400 exposed through the light-transmitting portion 570. Hereinafter, the explanation for the same or like parts as those of the aforementioned embodiment will be omitted.

Figure 9A:
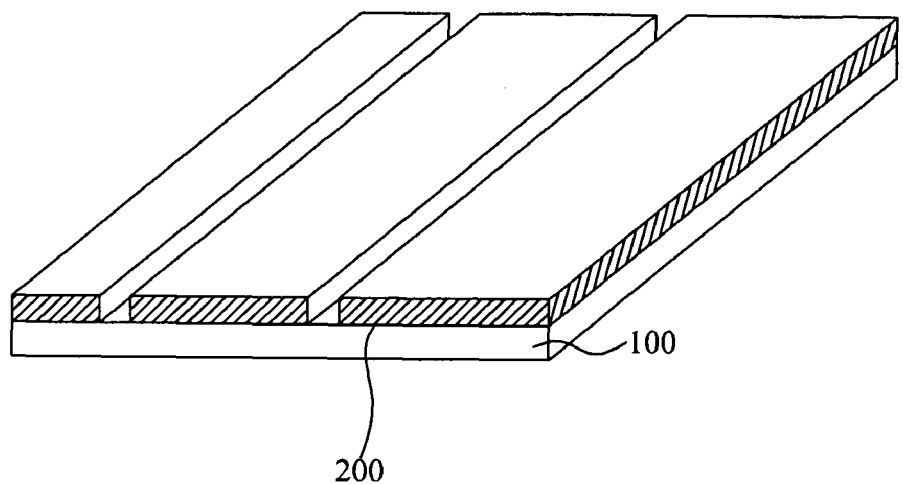
FIG. 9(A to E) is a series of perspective views illustrating a method for manufacturing a thin film type solar cell according to another embodiment of the present invention.

First, as shown in FIG. 9(A), the plurality of front electrodes 200 are formed at fixed intervals on the substrate 100.

Figure 9B:
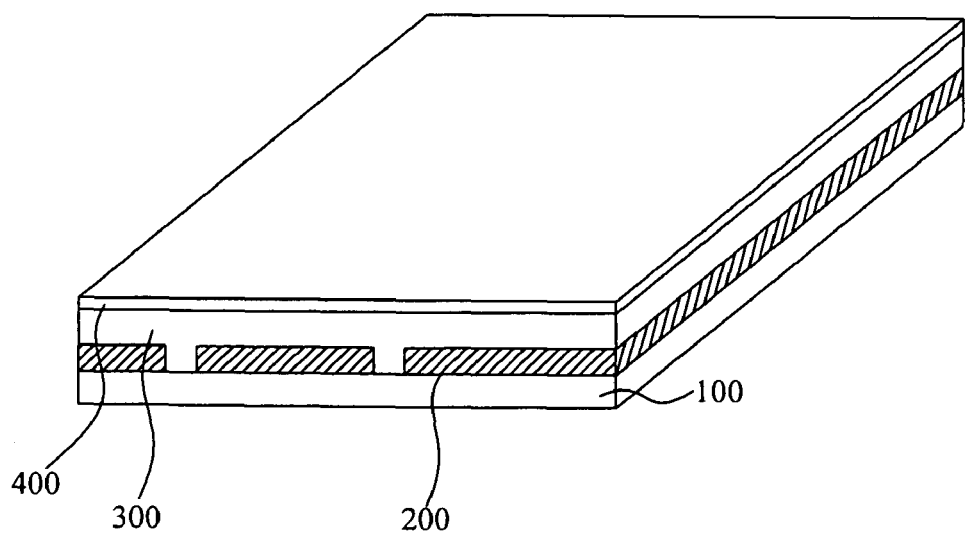

Then, as shown in FIG. 9(B), the semiconductor layer 300 and the transparent conductive layer 400 are sequentially formed on an entire surface of the substrate 100. The transparent conductive layer 400 may be omitted.

Figure 9C:
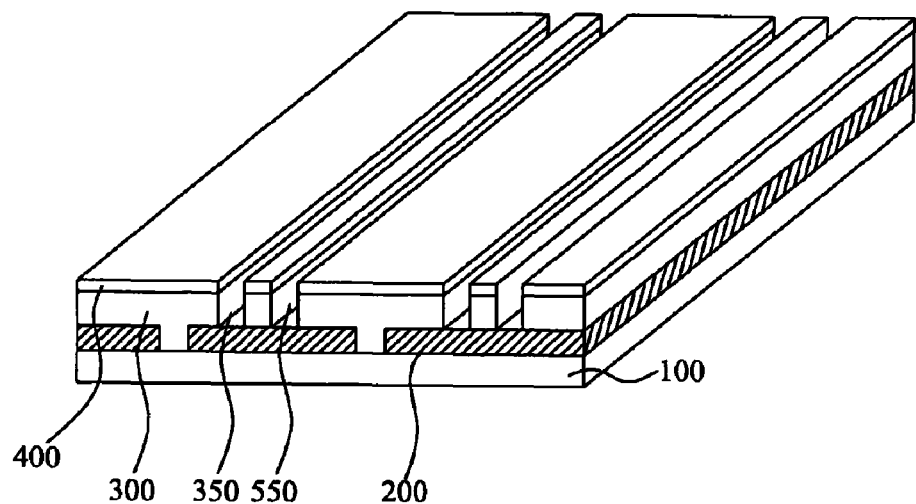

As shown in FIG. 9(C), the plurality of contact portions 350 and separating channels 550 are formed by removing the predetermined portions of the semiconductor layer 300 and transparent conductive layer 400.

Figure 9D:
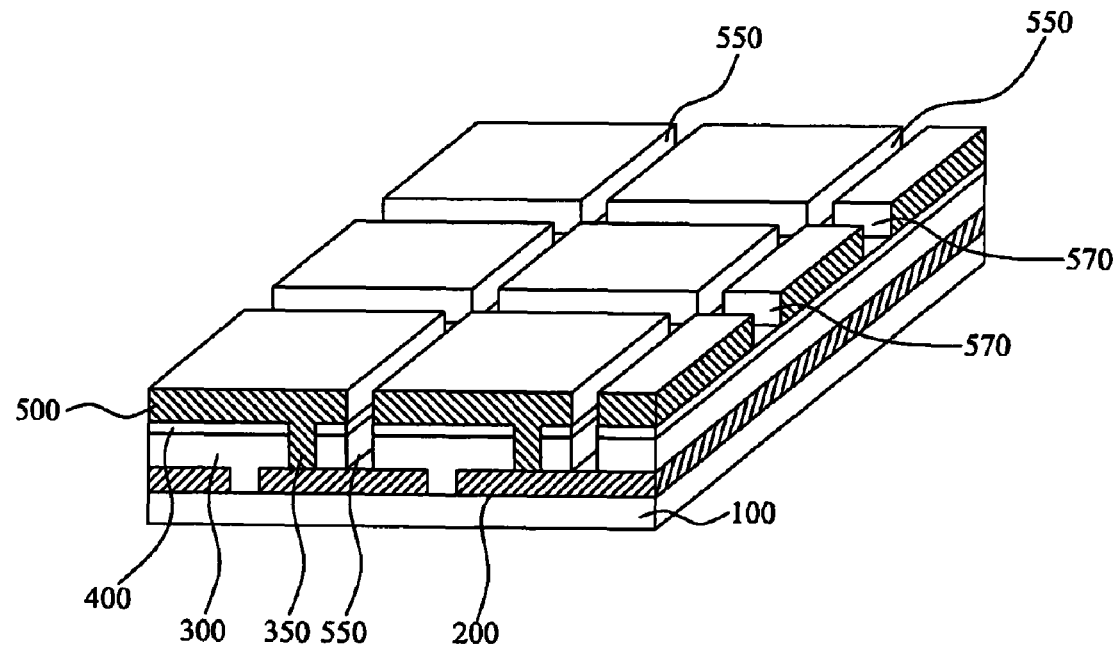

As shown in FIG. 9(D), the plurality of rear electrodes 500 are patterned at fixed intervals by each separating channel 550 interposed in-between, wherein each rear electrode 500 is electrically connected with the front electrode 200 through the contact portion 350. For enhancement of the light-transmission area, the rear electrode 500 is provided with the light-transmitting portion 570.

Figure 9E:
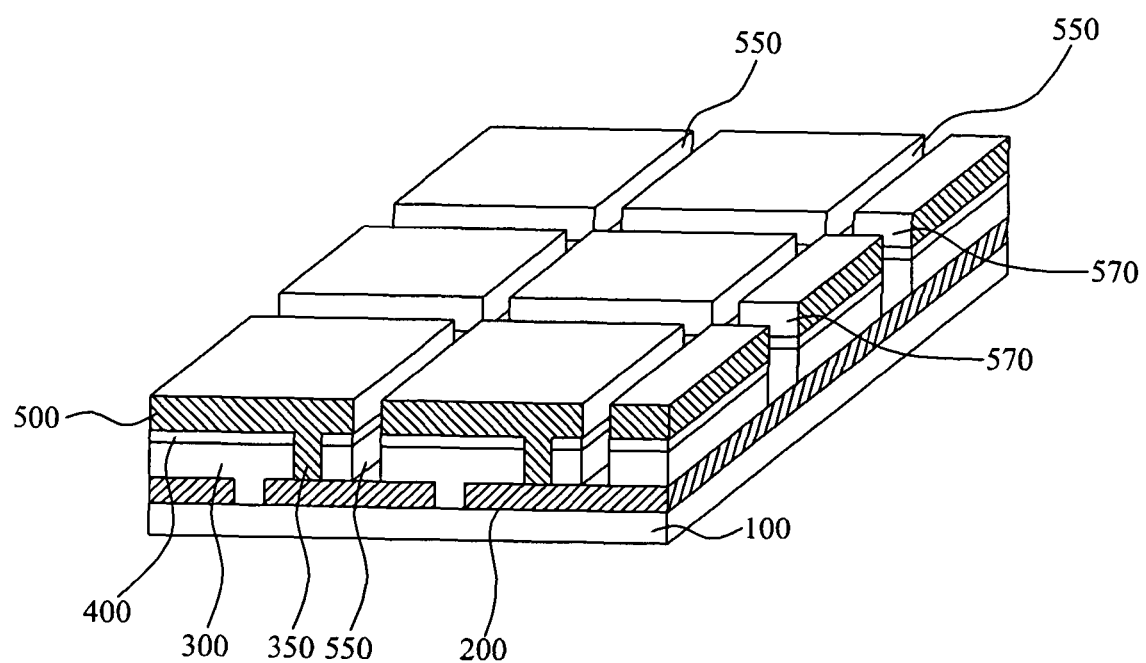

Next, as shown in FIG. 9(E), the thin film type solar cell of FIG. 5 is completed by removing the transparent conductive layer 400 exposed through the light-transmitting portion 570 and the semiconductor layer 300 positioned thereunder.

FIG. 9(E) illustrates that the front electrode 200 is exposed through the light-transmitting portion 570 by removing together the transparent conductive layer 400 positioned in the light-transmitting portion 570 and the semiconductor layer 300 positioned thereunder, but it is not limited to this. Instead, the semiconductor layer 300 may be exposed through the light-transmitting portion 570 by removing only the transparent conductive layer 400 positioned in the light-transmitting portion 570.

A process of removing the transparent conductive layer 400 and semiconductor layer 300 exposed through the light-transmitting portion 570 can be performed by a dry etching process. In this case, the transparent conductive layer 400 and the semiconductor layer 300 may be simultaneously removed by controlling an etching gas. In another aspect, the etching gas may be supplied in twice, whereby the transparent conductive layer 400 is firstly removed and then the semiconductor layer 300 is secondly removed.

The etching gas for removing the transparent conductive layer 400 may use at least one of $CH_4$, $C_2H_6$, $BCl_3$, $Cl_2$, Ar, and $H_2$.

The etching gas for removing the semiconductor layer 300 may a fluorine-based gas, a chlorine-based gas, or their mixture. At this time, the fluorine-based gas may use at least one of $C_2F_6$, $SF_6$, $CF_4$, and $C_4F_8$; and the chlorine-based gas may use at least one of $Cl_2$, $BCl_3$, and $SiCl_4$.

After removing the transparent conductive layer 400 and semiconductor layer 300 by the dry etching process, the substrate 100 from which the transparent conductive layer 400 and semiconductor layer 300 are removed may be treated by a drying process in an oven maintained at a temperature of about 80 to 150° C. The drying process may be omitted.

A process of removing the transparent conductive layer 400 and semiconductor layer 300 exposed through the light-transmitting portion 570 can be performed by a wet etching process using the rear electrode 500 as a mask.

Figure 10A:
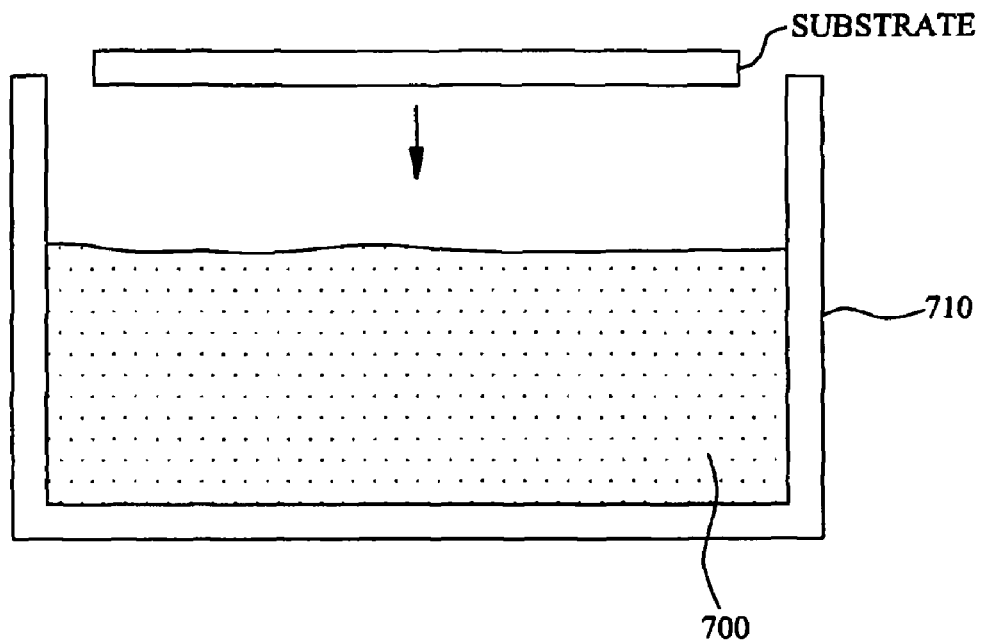
FIGS. 10(A and B) is a schematic diagram illustrating a wet etching method according to various embodiments of the present invention.
Figure 10B:
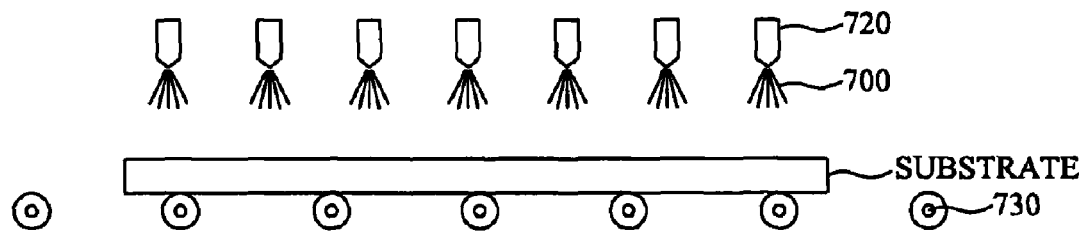

As shown in FIG. 10(A), the wet etching process may be performed by submerging the substrate 100 into a predetermined etchant 700 stored in an etching tub 710. As shown in FIG. 10(B), the wet etching process may be performed by spraying a predetermined etchant 700 onto the substrate 100 through the use of nozzle 720. Especially, the method explained with reference to FIG. 10(B), spraying the etchant 700 onto the substrate 100, enables the consecutive etching process by transferring the substrate 100 through the use of roller 730.

In comparison to the general dry etching method, the wet etching method is advantageous in that the wet etching method enables the decrease of manufacturing cost and the improved yield by the rapid processing.

For realizing these advantages of the wet etching method, it is important to satisfy the optimum conditions of the wet etching process. Through repetitive tests, the optimum conditions of the wet etching process can be summarized as follows. In detail, the optimum conditions of the wet etching process are related with an optimum composition of the etchant, an optimum temperature of the etchant, and an optimum etching processing time period.

First, the optimum composition of the etchant will be explained as follows. Preferably, the etchant includes at least one etching material selected from a group of NaOH, KOH, HCl, $NHO_3$, $H_2SO_4$, $H_3PO_3$, $H_2O_2$, and $C_2H_2O_4$. Also, the etching material may be diluted with water, whereby the water solution of the etching material may be used as the etchant (if the etching material is in a solid state, the solid-state etching material is inevitably diluted with water). In this case, a weight ratio of etching material to water is within a range of 0.1:9.9~9.9:0.1. More preferably, a weight ratio of etching material to water is within a range of 1:9~9:1.

If the weight ratio of etching material to water is less than 0.1:9.9 (for example, 0.01:9.99), the etching process is not smooth and the etching processing time period is increased. Meanwhile, if the weight ratio of etching material to water is more than 9.9:0.1 (for example, 9.99:0.01), it is difficult to dissolve the powdered etching material in water.

Both the optimum temperature of the etchant and the optimum etching processing time period will be explained as follows. First, the etchant is optimally maintained at a temperature of 20 to 200° C., preferably. It is more preferable that the etchant be optimally maintained at a temperature of 50 to 100° C. If the etchant temperature is maintained below 20° C., it may cause the unsmooth etching processing and long etching processing time period. In the meantime, if the etchant temperature is maintained above 200° C., it is difficult to control the extent of etching due to the rapid etching progress, thereby causing an over-etching problem.

Figure 11:
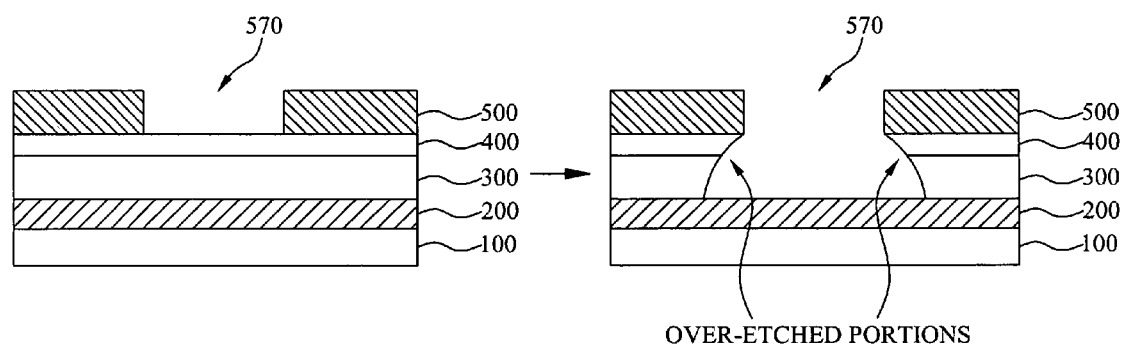
FIG. 11 is a cross section view illustrating an over etching occurred for a wet etching process.

Referring to FIG. 11, when the front electrode 200 is exposed through the light-transmitting portion 570 by removing the transparent conductive layer 400 and the semiconductor layer 300 from the light-transmitting portion 570 under such circumstance that the rear electrode 500 is used as the mask, the extent of etching may be excessive due to the high-speed etching processing, whereby the transparent conductive layer 400 and the semiconductor layer 300 may be over-etched. In addition, the rear electrode 500 may peel off.

The optimal etching processing time period is about 30 seconds to 10 minutes, preferably. Furthermore, it is more preferable that the optimal etching processing time period is about 2 minutes to 5 minutes. If the etching processing time period is less than 30 seconds, it is an insufficient time to accomplish a desired extent of etching, whereby the light-transmission area is not increased. In the meantime, if the etching processing time period is above 10 minutes, as explained with reference to FIG. 11, the transparent conductive layer 400 and the semiconductor layer 300 may be over-etched, and the rear electrode 500 may peel off.

FIG. 12(A to E) is a series of perspective views illustrating a method for manufacturing a thin film type solar cell according to another embodiment of the present invention, which is related with the method for manufacturing the thin film type solar cell of FIG. 5. Hereinafter, the explanation for the same or like parts as those of the aforementioned embodiment will be omitted.

Figure 12A:
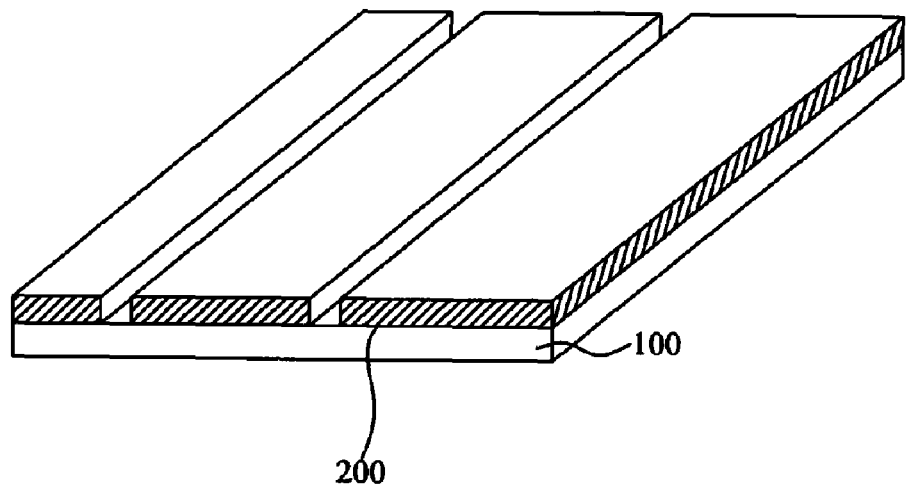
FIGS. 12(A to E) is a series of perspective views illustrating a method for manufacturing a thin film type solar cell according to another embodiment of the present invention.

First, as shown in FIG. 12(A), the plurality of front electrodes 200 are formed at fixed intervals on the substrate 100.

Figure 12B:
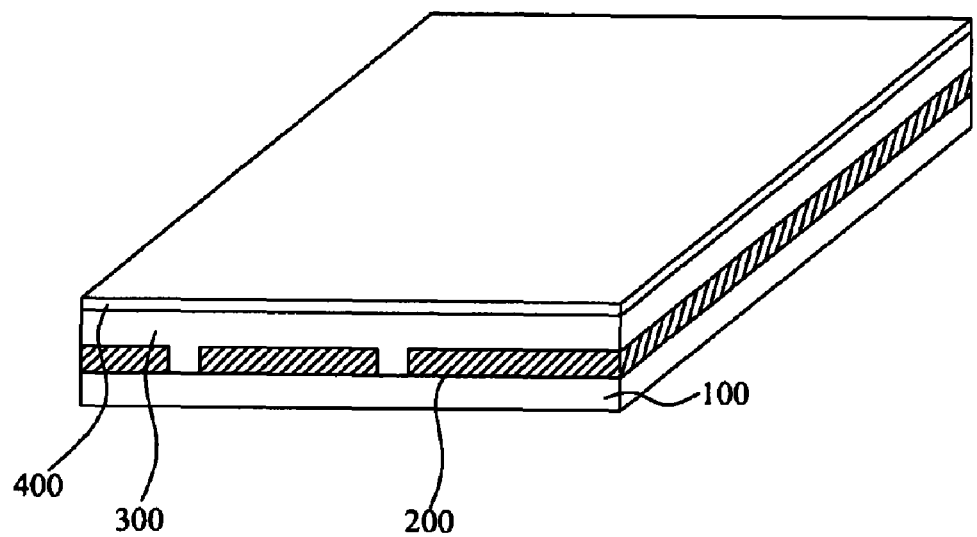

Then, as shown in FIG. 12(B), the semiconductor layer 300 and the transparent conductive layer 400 are sequentially formed on an entire surface of the substrate 100. The transparent conductive layer 400 may be omitted.

Figure 12C:
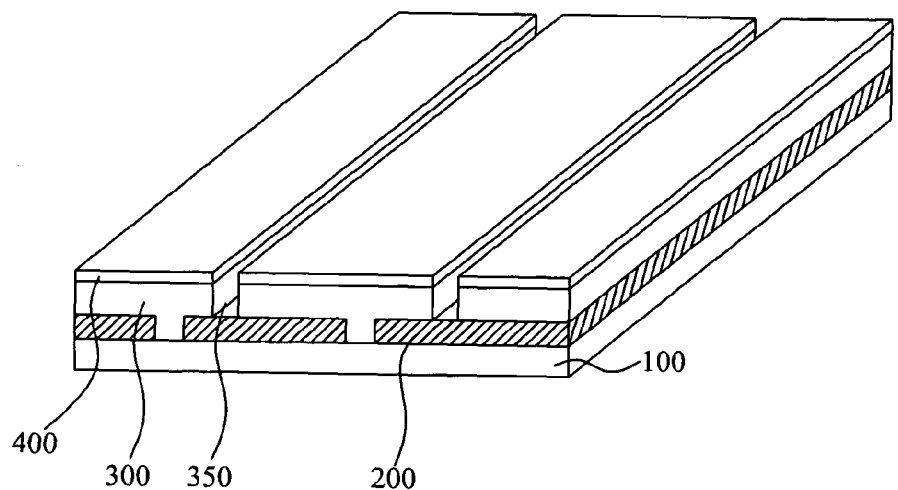

As shown in FIG. 12(C), the plurality of contact portions 350 are formed by removing the predetermined portions of the semiconductor layers 300 and transparent conductive layers 400. A process of forming the contact portions 350 may be performed by a laser scribing method.

In another embodiment of the present invention, the separating channels (See '550' of FIG. 9(C)) are not formed when forming the contact portions 350 in the semiconductor layer 300 and the transparent conductive layer 400. Accordingly, a process for forming the separating channels 550 may be omitted so that the number of a laser scribing apparatus to be used may be decreased and the process is simplified.

Figure 12D:
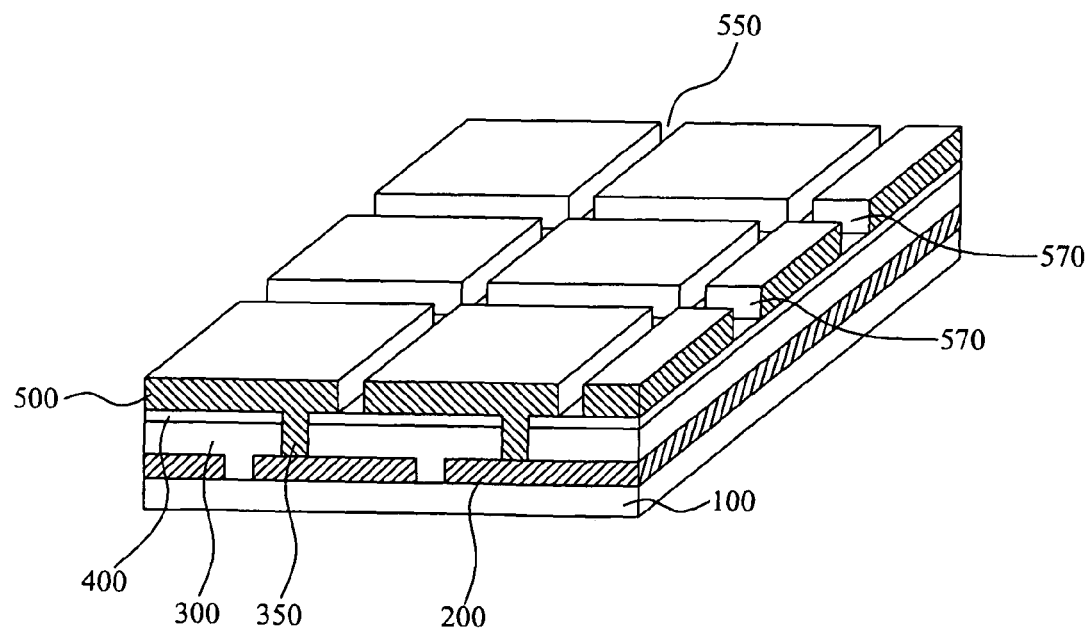

As shown in FIG. 12(D), the rear electrodes 500 are patterned at fixed intervals by each separating channel 550 interposed in-between, wherein each rear electrode 500 is electrically connected with the front electrode 200 through the contact portion 350. For enhancement of the light-transmission area, the rear electrode 500 is provided with the light-transmitting portion 570.

Figure 12E:
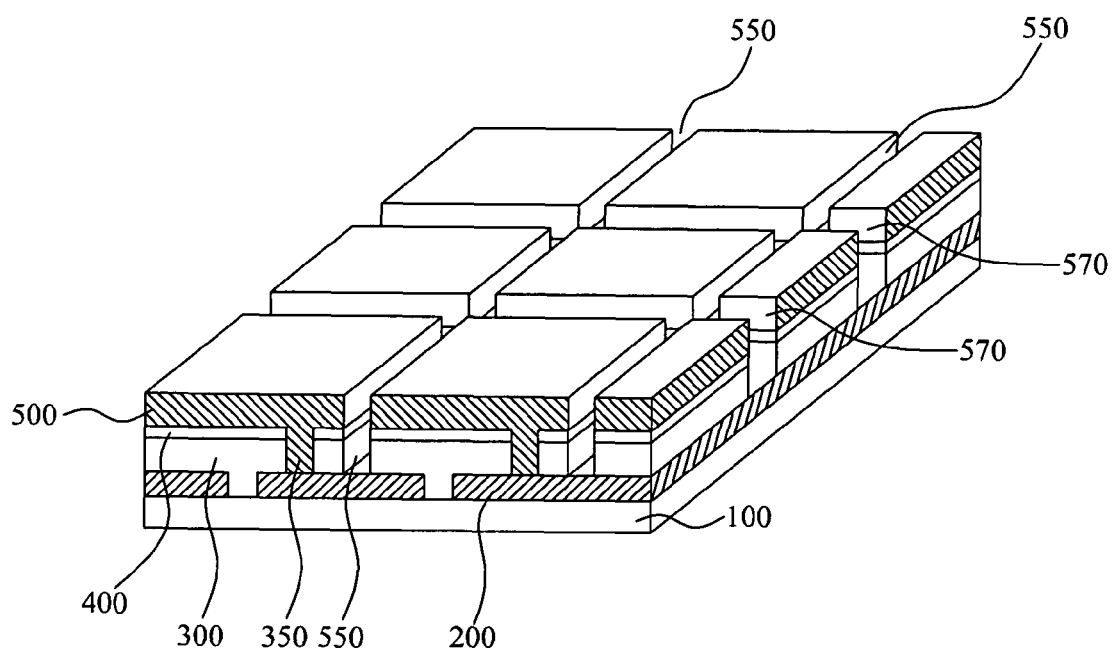

As shown in FIG. 12(E), the transparent conductive layer 400 positioned in the light-transmitting portion 570 and the semiconductor layer 300 positioned there under are removed together under such circumstance that the rear electrode 500 is used as the mask, whereby the front electrode 200 is exposed through the light-transmitting portion 570. Since the rear electrode 500 is used as the mask, the transparent conductive layer 400 positioned in the separating channel 550 and the semiconductor layer 300 positioned thereunder are removed, thereby the front electrode 200 is exposed through the separating channel 550. Thus, the thin film type solar cell of FIG. 5 is completed.

A process of removing the transparent conductive layer 400 and the semiconductor layer 300 positioned thereunder is performed by the aforementioned dry etching process or wet etching process.

Accordingly, the thin film type solar cell according to the present invention and the method for manufacturing the same has the following advantages.

In the thin film type solar cell according to the present invention, the light-transmitting portion is patterned in the rear electrode, whereby the solar ray can be transmitted through the light-transmitting portion. In comparison to the related art thin film type solar cell, the thin film type solar cell according to the present invention obtains the light-transmission area which can obtain the enough visible range to be used as the substitute for the glass window.

In the thin film type solar cell according to the present invention, the rear electrode is patterned by the various methods using the printing process. In comparison to the related art method using the laser-scribing process, the method according to the present invention, that is, the method using the printing process, can realize the simplified process and also prevent the contamination of the substrate. Since the rear electrode is patterned by the printing method, it is possible to control the entire size of the light-transmitting portion with easiness. Thus, if needed, the visible range can be controlled appropriately by changing the light-transmitting portion of solar cell to a desired range.

Accordingly, as the front electrode is exposed through the light-transmitting portion by removing the transparent conductive layer and the semiconductor layer, the solar ray being incident on the substrate from the lower side of the substrate passes through only the substrate and the front electrode when being transmitted through the light-transmitting portion, thereby resulting in the high transmittance of solar ray.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents

What is claimed is:

1. A method for manufacturing a thin film type solar cell, comprising:
    forming a plurality of front electrodes at fixed intervals on a substrate surface;
    forming a semiconductor layer over the entire substrate surface atop the plurality of front electrodes;
    simultaneously forming a plurality of contact portions and separating channels by removing predetermined portions of the semiconductor layer; and
    after forming the plurality of contact portions and separating channels, printing a plurality of rear electrodes in a pattern having fixed intervals such that the separating channels between adjacent rear electrodes in the pattern remain open, wherein each rear electrode is electrically connected with one of the front electrodes through one of the plurality of contact portions, and each rear electrode includes a light-transmitting portion therein so as to enhance a light-transmission area.

2. The method of claim 1, further comprising:
    removing predetermined portions of said semiconductor layer from the light-transmitting portion using the rear electrode as a mask so as to expose the front electrode through the light-transmitting portion.

3. The method of claim 2, further comprising:
    forming a transparent conductive layer on the semiconductor layer after forming the semiconductor layer; and
    removing predetermined portions of said light-transmitting portion concurrently with removing said predetermined portions of said semiconductor layer, thereby simultaneously forming the contact portions and the separating channels.

4. The method of claim 3, further comprising:
    removing the transparent conductive layer from the light-transmitting portion using the rear electrode as a mask so as to expose the semiconductor layer through the light-transmitting portion.

5. The method of claim 3, further comprising:
    removing the transparent conductive layer and semiconductor layer from the light-transmitting portion using the rear electrode as a mask so as to expose the front electrode through the light-transmitting portion.

6. The method of claim 5, wherein removing the transparent conductive layer and semiconductor layer from the light-transmitting portion comprises a dry etching process.

7. The method of claim 6, wherein the dry etching process uses at least one of $CH_4$, $C_2H_6$, $BCl_3$, $Cl_2$, Ar, and $H_2$.

8. The method of claim 5, wherein removing the transparent conductive layer and semiconductor layer from the light-transmitting portion comprises a wet etching process.

9. The method of claim 8, wherein the wet etching process uses an etchant including at least one etching material selected from the group consisting of NaOH, KOH, HCl, $NHO_3$, $H_2SO_4$, $H_3PO_3$, $H_2O_2$, and $C_2H_2O_4$.

10. The method of claim 9, wherein the etchant is maintained at a temperature of 20 to 200° C.

11. The method of claim 9, wherein the wet etching process comprises submerging the substrate into the etchant, or spraying the etchant onto the substrate.

12. The method of claim 1, wherein simultaneously forming the contact portions and the separating channels comprises dividing a laser beam from a laser oscillator into a plurality of laser beams in a plurality of directions.

13. The method of claim 1, wherein forming the semiconductor layer comprises sequentially depositing a first semiconductor layer, a buffer layer, and a second semiconductor layer.

14. A method for manufacturing a thin film type solar cell, comprising:
    forming a plurality of front electrodes at fixed intervals on a substrate;
    forming a semiconductor layer on an entire surface of the substrate including the plurality of front electrodes;
    forming a transparent conductive layer on the semiconductor layer after forming the semiconductor layer;
    forming a plurality of contact portions by removing predetermined portions of the semiconductor layer and the transparent conductive layer;
    printing a plurality of rear electrodes in a pattern having fixed intervals that expose areas of the transparent conductive layer in which separating channels are to be formed, wherein each rear electrode is electrically connected with one of the front electrodes through one of the contact portions, and each rear electrode includes a light-transmitting portion therein so as to enhance a light-transmission area; and
    removing the semiconductor layer and the transparent conductive layer from the light-transmitting portions and separating channels by a dry or wet etching process using the rear electrodes as a mask, wherein the transparent conductive layer and the semiconductor layer have a same pattern after the dry or wet etching process.

15. The method of claim 14, wherein forming the semiconductor layer comprises sequentially depositing a first semiconductor layer, a buffer layer, and a second semiconductor layer.

16. The method of claim 7, wherein the dry etching process further uses at least one fluorine-based gas.

17. The method of claim 14, wherein the transparent conductive layer comprises ZnO, ZnO:B, ZnO:Al, or Ag.

18. The method of claim 14, wherein forming the transparent conductive layer comprises sputtering or MOCVD (metal organic chemical vapor deposition).

19. The method of claim 14, wherein removing the semiconductor layer and the transparent conductive layer from the light-transmitting portions and separating channels comprises a dry etching process using at least one of $CH_4$, $C_2H_6$, $BCl_3$, $Cl_2$, Ar and $H_2$.

20. The method of claim 14, wherein removing the semiconductor layer and the transparent conductive layer from the light-transmitting portions and separating channels comprises wet etching using an etchant selected from the group consisting of NaOH, KOH, HCl, $NHO_3$, $H_2SO_4$, $H_3PO_3$, $H_2O_2$, and $C_2H_2O_4$.

* * * * *